(12) United States Patent
Knutson

(10) Patent No.: US 9,086,509 B2
(45) Date of Patent: Jul. 21, 2015

(54) AZICON BEAM POLARIZATION DEVICES

(75) Inventor: Jay R. Knutson, Kensington, MD (US)

(73) Assignee: The United States of America as represented by the Secretary, Department of Health and Human Services, Washington, DC (US)

( * ) Notice: Subject to any disclaimer, the term of this patent is extended or adjusted under 35 U.S.C. 154(b) by 319 days.

(21) Appl. No.: 13/581,107

(22) PCT Filed: Feb. 22, 2011

(86) PCT No.: PCT/US2011/025755
§ 371 (c)(1),
(2), (4) Date: Aug. 24, 2012

(87) PCT Pub. No.: WO2011/106325
PCT Pub. Date: Sep. 1, 2011

(65) Prior Publication Data
US 2012/0320458 A1 Dec. 20, 2012

Related U.S. Application Data

(60) Provisional application No. 61/308,202, filed on Feb. 25, 2010.

(51) Int. Cl.
G02B 5/30 (2006.01)
G02B 5/00 (2006.01)
G02B 27/28 (2006.01)
G03F 7/20 (2006.01)

(52) U.S. Cl.
CPC .............. *G02B 5/001* (2013.01); *G02B 27/283* (2013.01); *G02B 27/286* (2013.01); *G03F 7/70225* (2013.01); *G03F 7/70566* (2013.01)

(58) Field of Classification Search
CPC .............. G02B 5/00; G02B 6/00; G02B 5/04; G02B 5/30–5/3091; G02F 3/00
See application file for complete search history.

(56) References Cited

U.S. PATENT DOCUMENTS 4,598,408 A  7/1986  O'Keefe
(Continued)

FOREIGN PATENT DOCUMENTS

DE       585700 C     10/1993
(Continued)

OTHER PUBLICATIONS

Product literature for Radial Polarization Converter, ARCoptix S.A., available at www.arcoptix.com.
(Continued)

*Primary Examiner* — Ricky Mack
*Assistant Examiner* — Robert E Tallman
(74) *Attorney, Agent, or Firm* — Klarquist Sparkman, LLP

(57) ABSTRACT

Polarizers and polarizing beam splitter include one or more pairs of axicons that are configured to separate an input beam into a radially polarized component and a tangentially (or azimuthally) polarized component. A second axicon pair can be provided to recombine the tangentially polarized component so as to provide a more uniform beam intensity. The radially polarized component can be reflected or otherwise directed so that one or both the radial and tangential components are available for use.

24 Claims, 6 Drawing Sheets

(56) References Cited

U.S. PATENT DOCUMENTS

| | | | |
|---|---|---|---|
| 4,755,027 | A | 7/1988 | Schafer |
| 5,262,889 | A | 11/1993 | Fink |
| 5,436,761 | A | 7/1995 | Kamon |
| 5,677,755 | A | 10/1997 | Oshida et al. |
| 6,191,880 | B1 * | 2/2001 | Schuster ............... 359/238 |
| 6,885,502 | B2 | 4/2005 | Schuster |
| 7,043,082 | B2 | 5/2006 | Larkin et al. |
| 7,167,295 | B2 * | 1/2007 | Williams et al. ............ 359/280 |
| 7,599,069 | B2 | 10/2009 | Toussaint, Jr. et al. |
| 2001/0024311 | A1 | 9/2001 | Larkin et al. |
| 2002/0126380 | A1 | 9/2002 | Schuster |
| 2006/0028706 | A1 | 2/2006 | Totzeck et al. |
| 2006/0146384 | A1 | 7/2006 | Schultz et al. |
| 2007/0183036 | A1 | 8/2007 | Lipson et al. |
| 2009/0027663 | A1 | 1/2009 | Svensson |

FOREIGN PATENT DOCUMENTS

| | | |
|---|---|---|
| DE | 103 21 598 A1 | 12/2004 |
| DE | 103 22 375 A1 | 12/2004 |
| EP | 1 343 051 A1 | 9/2003 |
| WO | WO 2004/090578 A2 | 10/2004 |
| WO | WO 2004/102230 | 11/2004 |
| WO | WO 2004/102273 A3 | 11/2004 |

OTHER PUBLICATIONS

D. Fink, "Polarization of Effects of Axicons," Applied Optics 18:581-582 (Mar. 1, 1979).
Kotlyar et al., "Sharp Focus Area of Radially-Polarized Gaussian Beam Propagation through an Axicon," Progress in Electromagnetics Research C, 5:35-43 (2008).
Lavoie, "Conical Axicons Used as Optical Polar Everters," Applied Optics, 14(7):1482-1484 (Jul. 1975).
Oemrawsingh et al., "Production and Characterization of Spiral Phase Plates for Optical Wavelengths," Applied Optics 43:688-694 (Jan. 20, 2004).
Pääkkönen et al., "General Vectorial Decomposition of Electromagnetic Fields with Application to Propagation-Invariant and Rotating Fields," Optics Express, 10:949959 (Sep. 9, 2002).
F. P. Schäfer, "On Some Properties of Axicons," Applied Physics B, 39:1-8, (1986).
Sueda et al., "Laguerre-Gaussian Beam Generated with a Multilevel Spiral Phase Plate for High Intensity Laser Pulses," Optics Express 12:3548-3553 (Jul. 26, 2004).
Tidwell et al., "Efficient Radially Polarized Laser Beam Generation with a Double Interferometer," Applied Optics 32:5222-5229 (Sep. 20, 1993).
International Search Report and Written Opinion for PCT/US2011/025755, mailed Aug. 2, 2011, 14 pages.

\* cited by examiner

AZICON BEAM POLARIZATION DEVICES

CROSS REFERENCE TO RELATED APPLICATIONS

This is the U.S. National Stage of International Application No. PCT/US2011/025755, filed Feb. 22, 2011, which was published in English under PCT Article 21(2), which in turn claims the benefit of U.S. Provisional Application No. 61/308,202, filed Feb. 25, 2010, both of which are incorporated herein by reference.

FIELD

The disclosure pertains to polarizers that produce tangentially and radially polarized beams.

BACKGROUND

The state of polarization of an optical beam can be a significant factor in determining the beam's spatial profile, particularly if the optical beam is focused to a small spot using high numerical aperture optics. For example, if a "donut" shaped focused spot is desired having an on-axis null, beam phase must vary in such a way as to destructively interfere on-axis in order to create the null. However, even if beam phase is precisely controlled, destructive interference may not be complete depending on the beam state of polarization. If the optical beam is tangentially polarized, a deep null can be formed. If the optical beam is radially polarized, the beam will have axial components that do not interfere destructively, and the depth of the beam null will be limited. This is especially true for beams focused to a small spot with high numerical aperture optics, as the magnitudes of the axial polarization components increase as a function of numerical aperture. For applications requiring an optical beam having a deep central null, polarization control may permit increased resolution.

Properties and applications of tangentially and radially polarized beams are described in Toussaint et al., U.S. Pat. No. 7,599,069, which is incorporated herein by reference. According to Toussaint, tangentially polarized beams can be used in microscopy, including multi-photon microscopy as well as other applications. Schultz et al., U.S. Patent Application Publication 2006/0146384A1, which is incorporated herein by reference, describes the use of tangentially and radially polarized beams in microlithography.

Conical surfaces have been used to produce tangentially and radially polarized beams. For example, Schäfer, "On Some Properties of Axicons," Appl. Phys. B 39:1, 3 (1960), which is incorporated herein by reference, describes a polarizer that uses four conical surfaces to produce a transmitted optical beam that is either tangentially or radially polarized based on the dielectric coating applied to the conical surfaces. Other previous attempts to provide suitable polarization control are described in Lipson et al., U.S. Patent Application Publication 2007/0183036 and Kamon, U.S. Pat. No. 5,436,761, both of which are incorporated herein by reference. Lipson discloses two conical reflectors positioned opposite each other and a polarizer situated between the two conical reflectors. Lipson's conical reflectors reflect input beams in all polarization states, and require a polarizer to provide a polarized output beam.

In order to provide superior performance in multi-photon microscopy, microlithography, and other applications, improved polarizers and polarizing beam splitters are needed.

SUMMARY OF THE DISCLOSURE

According to some examples, polarizers comprise an inner axicon situated on an axis and configured to receive an optical beam propagating along the axis. An outer axicon is situated on the axis and has a reflective, axially outer surface. A reflective surface is situated at an interface of an axially outer surface of the inner axicon and an axially inner surface of the outer axicon, and is configured to reflect a portion of the optical beam in a first state of polarization to the reflective axially outer surface of the outer axicon, and to transmit a portion of the optical beam in a second state of polarization along the axis. In some examples, the first state of polarization is a radial polarization and the second state of polarization is a tangential polarization or the second state of polarization is a radial polarization and the first state of polarization is a tangential polarization. In typical examples, the reflective surface comprises a multilayer dielectric coating. In other embodiments, the inner axicon is formed of an optically transparent solid material such as glass or fused silica. In additional examples, a retardation plate is situated so as to substantially convert the beam portion in the first state of polarization to the second state of polarization or the beam portion in the second state of polarization to the first state of polarization.

Polarizing beam splitters comprise a first axicon pair situated along an axis that includes an inner axicon and an outer axicon configured so that a portion of an incident beam in a first state of polarization is transmitted and a portion of the incident beam in a second state of polarization is reflected by the inner axicon to an outer surface of the outer axicon. A second axicon pair is situated along the axis and includes an inner axicon and an outer axicon configured so that the portion of the incident beam reflected by the outer surface of the second axicon of the first axicon pair is directed to an outer surface of the outer axicon of the second axicon pair and reflected by the inner axicon of the second axicon pair so as to form an output beam in a first state of polarization. An optical reflector is situated between the first axicon pair and the second axicon pair so as to receive and reflect the beam transmitted by the first axicon pair in the first state of polarization. In some examples, the first state of polarization is a radial polarization and the second state of polarization is a tangential polarization or vice versa. In some examples, at least one of the inner axicons is formed of an optically transparent solid material such as glass or fused silica. In some examples, a retardation plate is situated so as to substantially convert the beam portion in the first state of polarization to the second state of polarization or the beam portion in the second state of polarization to the first state of polarization.

Methods comprise separating portions of an optical beam propagating along an axis and having first and second states of polarization at a surface of a first axicon by reflecting the beam portion in the first state of polarization and transmitting the beam portion in a second state of polarization. A second axicon is situated so that the reflected beam portion from the first axicon forms a beam in the first state of polarization that propagates along or parallel to the axis. In some examples, the beam in the first state of polarization is directed to a second axicon pair so as to reduce a cross-sectional area of the beam. In other examples, the first state of polarization is a tangential polarization and the second state of polarization is a radial polarization.

The foregoing and other features and advantages of the invention will become more apparent from the following detailed description of a several embodiments which proceeds with reference to the accompanying figures.

DETAILED DESCRIPTION OF SEVERAL EMBODIMENTS

Figure 1:
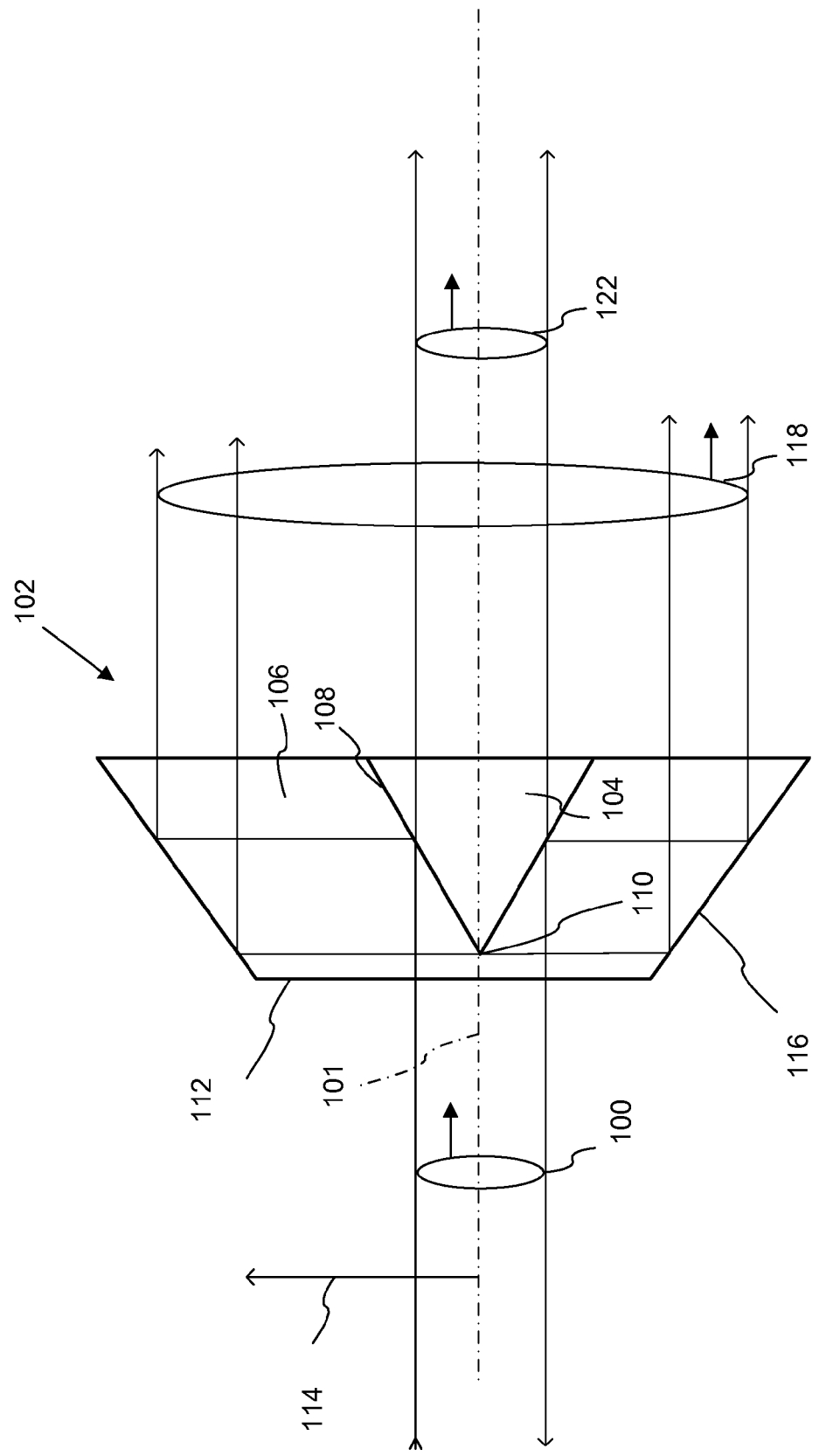
FIG. 1 is a schematic sectional diagram of a transmissive axicon-based beam separator.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Methods and apparatus are provided that are typically based on one or more, or one or more pairs of axicons that are arranged to separate radial and tangential polarization components. As used herein, an axicon is a lens that is a section of a cone and is sometimes referred to herein as a conical lens. Axicons can be solid sections of a cone that can include a cone apex or can be truncated sections. Such axicons are typically formed of an optical glass, fused silica, or other convenient transmissive media. Other axicons are sections of hollow conical shells having a reflective surface that is defined by a dielectric, metallic, or other reflective coating. While axicons generally extend 360 degrees about an axis, some portions may be missing or optically obscured to provide for mounting or access for additional optical beams and components. Cones having circular cross-sections are typically preferred, but cones having elliptical or other curved cross-sections can be used, and in some examples, polygonal cross-sections can be used. In still other examples, an axicon can be formed as conical relief volume is a solid material, such as a conical shaped void in a glass or fused silica block.

As used herein, "optical beam" refers to propagating electromagnetic radiation in a wavelength range of between about 50 nm and 50 μm, although in many practical examples, a wavelength range of between about 200 nm and 2 μm is used. While beams are conveniently collimated, collimation is not required and beams can be converging or diverging, and need not be circularly symmetric. In the following description, beams are referred to as polarized or being in particular state of polarization. Typical beams are not perfectly polarized, and as used herein beams are substantially polarized so that at least about 75%, 80%, 90%, 95% or more of beam power is in a selected state of polarization. Optical beams and optical components are conveniently illustrated as situated along or on a linear axis. Such an axis can be bent of folded or otherwise not a straight line using optical components such as minors and prisms. Such bent axes are not included in the drawings for convenient illustration.

Optical beams can be described as propagating along or perpendicular to an axis. As used herein, such propagation refers to propagation at angles of less than about 15 degrees, 10 degrees, 5 degrees, or 1 degree with respect to the axis or perpendicular to the axis. In some examples, optical beams are divergent or convergent with beam angles that can be substantial. In such cases, a central axis about which beam divergence or convergence is substantially symmetric can be used as a beam axis of propagation. In some examples, beam divergence can be characterized by more than one divergences angle (such as in cylindrical beams or beams produced directly by typical laser diodes), but a central propagation axis can still be identified.

In the following description, certain optical elements and surfaces are referred to as having polarization dependent reflectances and/or transmittances. As used herein, a polarizing reflector or reflective surface has a ratio of a reflectance in a first state of polarization to a reflectance in a second (orthogonal) state of polarization of at least 2:1, 4:1, 8:1, 20:1, 100:1 or greater. Typical reflectances are greater than about 50%, 75%, 90%, 95%, 99%, or more.

A representative optical system that can provide tangentially and radially polarized beams is illustrated in FIG. 1. An optical input beam 100 is directed along an axis 101 to an axicon assembly 102 that includes an inner axicon 104 and an outer axicon 106 that contact at a surface 108. As shown in FIG. 1, an apex 110 of the inner axicon 104 is spaced apart from an input surface 112 that is defined by truncation of the outer axicon 106. The input surface 112 is typically planar, but can be spherically, cylindrically, elliptically or otherwise curved so as to provide positive or negative optical power along one or more axes. Cone angles that define the axicons can be the same or different, and angles can be selected to promote polarization dependence as described below. Typically, the cone angles of both axicons are the same as shown in FIG. 1.

The surface 108 is typically provided with a dielectric coating such as a multilayer dielectric coating configured to enhance the reflectance of an s-polarization and transmittance of a p-polarization. Such coatings are well known and are in routine use in so-called polarizing beam splitter cubes. Portions of the input beam that are polarized in the plane of incidence (p-polarized) are transmitted by the inner axicon 104 while portions of the input beam that are polarized perpendicularly to the plane of incidence (s-polarized) are reflected at the surface 108. In some examples, s-polarized beam flux is transmitted and p-polarized portions are reflected. Because the axicon assembly 102 is rotationally symmetric about the axis 101, p-polarized optical flux is parallel to a radial direction such as 114 (for the uppermost portion of the beam 100) and thus corresponds to radial polarization. Radial polarization is parallel to a vector that is perpendicular to and proceeds out from the central axis to the point in the beam that is to be measured. Similarly, s-polarized optical flux is perpendicular to both the radial direction (such as 114) and the central axis, and corresponds to tangential (or "azimuthal") polarization.

Tangentially polarized beam portions are reflected at the surface 108 and directed to an outer surface 116 of the outer axicon 106. At the outer surface, these portions are reflected so as to form a tangentially polarized output beam 118 having a central hole having a diameter based on diameters of the inner and outer axicons. A radially polarized beam portion is transmitted through the inner axicon 104 to and forms a radially polarized beam 122. In the example of FIG. 1, cone angles of the inner axicon 104 and the outer axicon 106 are substantially the same so that the reflected tangentially and radially polarized beams propagate substantially parallel to the input beam and the axis 101. In other examples, the cone angles differ, and the tangentially polarized beam can propagate in a direction that is not parallel to the axis 101.

The optical system of FIG. 1 separates radial and tangentially polarized beam portions and these beams can be individual directed to any intended targets as needed. In some applications, one of these portions is discarded. In other applications an oriented wave plate such as those described in Albert et al., U.S. Pat. No. 7,548,370, which is incorporated herein by reference, can be used to convert either a tangentially polarized beam into a radially polarized beam or vice versa.

Figure 2:
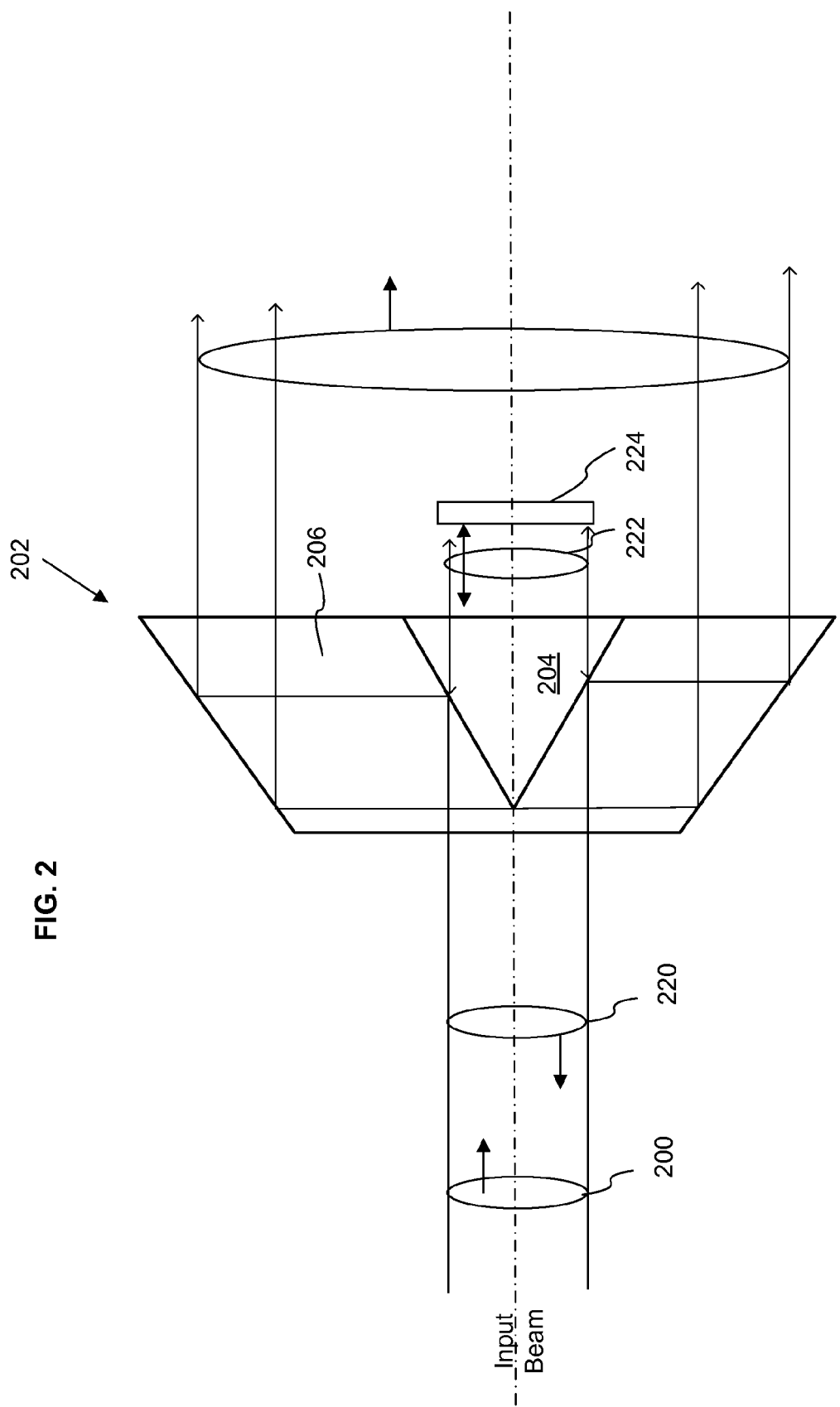
FIG. 2 is a schematic sectional diagram of a reflective axicon-based beam separator.

FIG. 2 illustrates a representative axicon-based polarizer 202 configured to produced radially and tangentially polarized beams from an input beam 200. The example of FIG. 2 is similar to that of FIG. 1 but further includes a metallic, dielectric, or other reflector 224 situated to reflect a transmitted radially polarized beam 222 back towards to axicons 204, 206 so as to produce a radially polarized output beam 220 that propagates parallel to but in an opposite direction to the input beam 200. Reflectors or other optical elements can be situated so as to direct one or both of the radially or tangentially polarized beams as needed.

Figure 3:
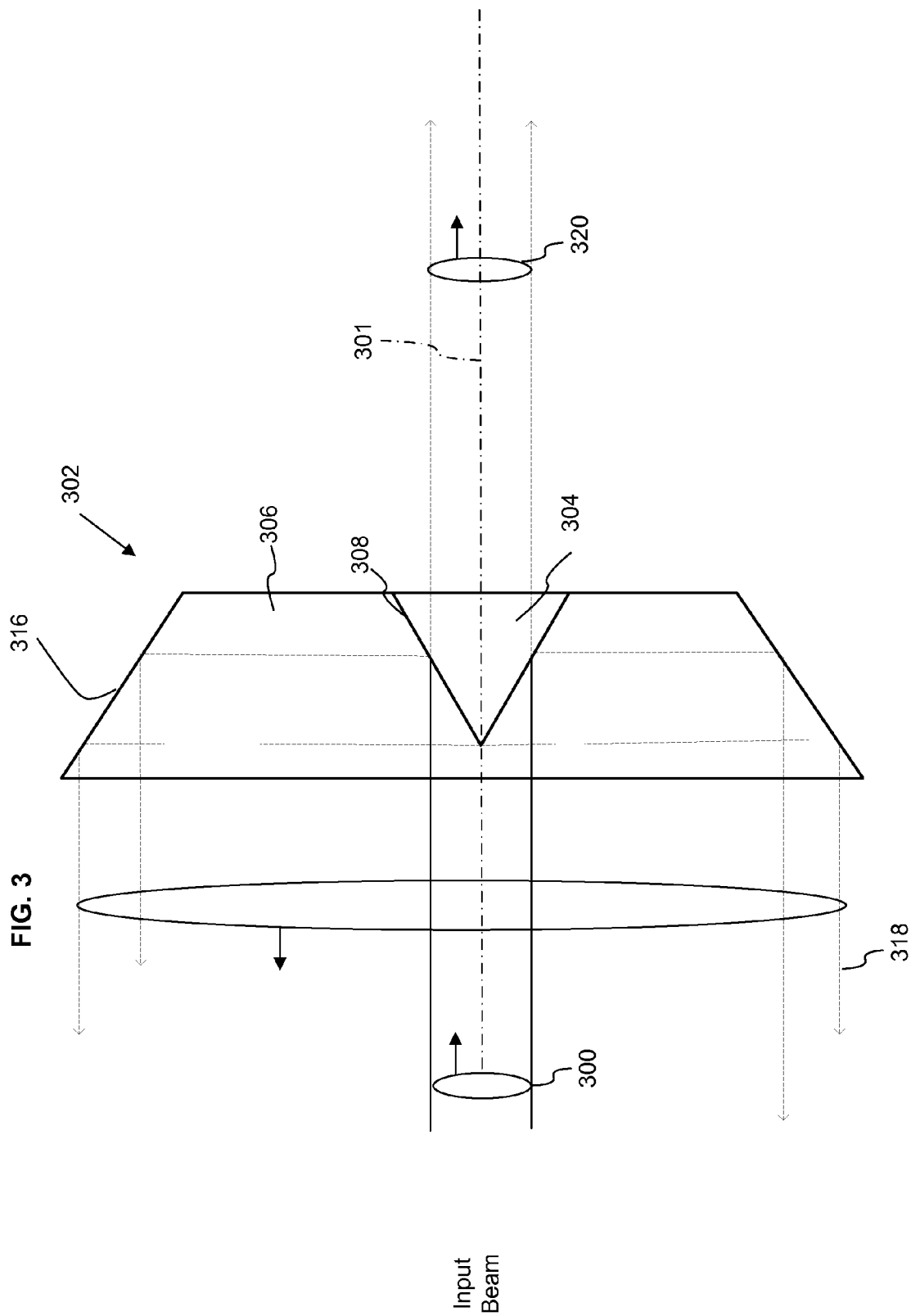
FIG. 3 is a schematic sectional diagram of a reflective axicon-based beam separator.

FIG. 3 illustrates a representative polarizer or polarizing beam splitter configured so that an optical input beam 300 is directed along an axis 301 to an axicon assembly 302 that includes an inner axicon 304 and an outer axicon 306 that contact at a surface 308. The surface 308 is typically provided with a dielectric coating such as a multilayer dielectric coating configured to enhance the reflectance of an s-polarization and transmittance of a p-polarization.

Tangentially polarized beam portions are reflected at the surface 308 and directed to an outer surface 316 of the outer axicon 306. At the outer surface 306, these portions are reflected so as to form a tangentially polarized output beam 318 having a central hole with a diameter based on diameters of the inner and outer axicons. A radially polarized beam portion is transmitted through the inner axicon 304 and forms a radially polarized beam 320. In the example of FIG. 3, cone angles of the inner axicon 304 and the outer axicon 306 are substantially the same (but with axicons oppositely facing) so that the reflected tangentially and radially polarized beams propagate substantially parallel to the input beam and the axis 301 but in opposite directions. In other examples, the cone angles differ, and the tangentially polarized beam can propagate in a direction that is not parallel to the axis 301. As shown in FIG. 3, the output beam 318 has a central hole, but additional optical elements can be provided to recombine the beam portions to reduce or eliminate the central hole. In this way, a more uniform beam intensity distribution can be produced.

Figure 4:
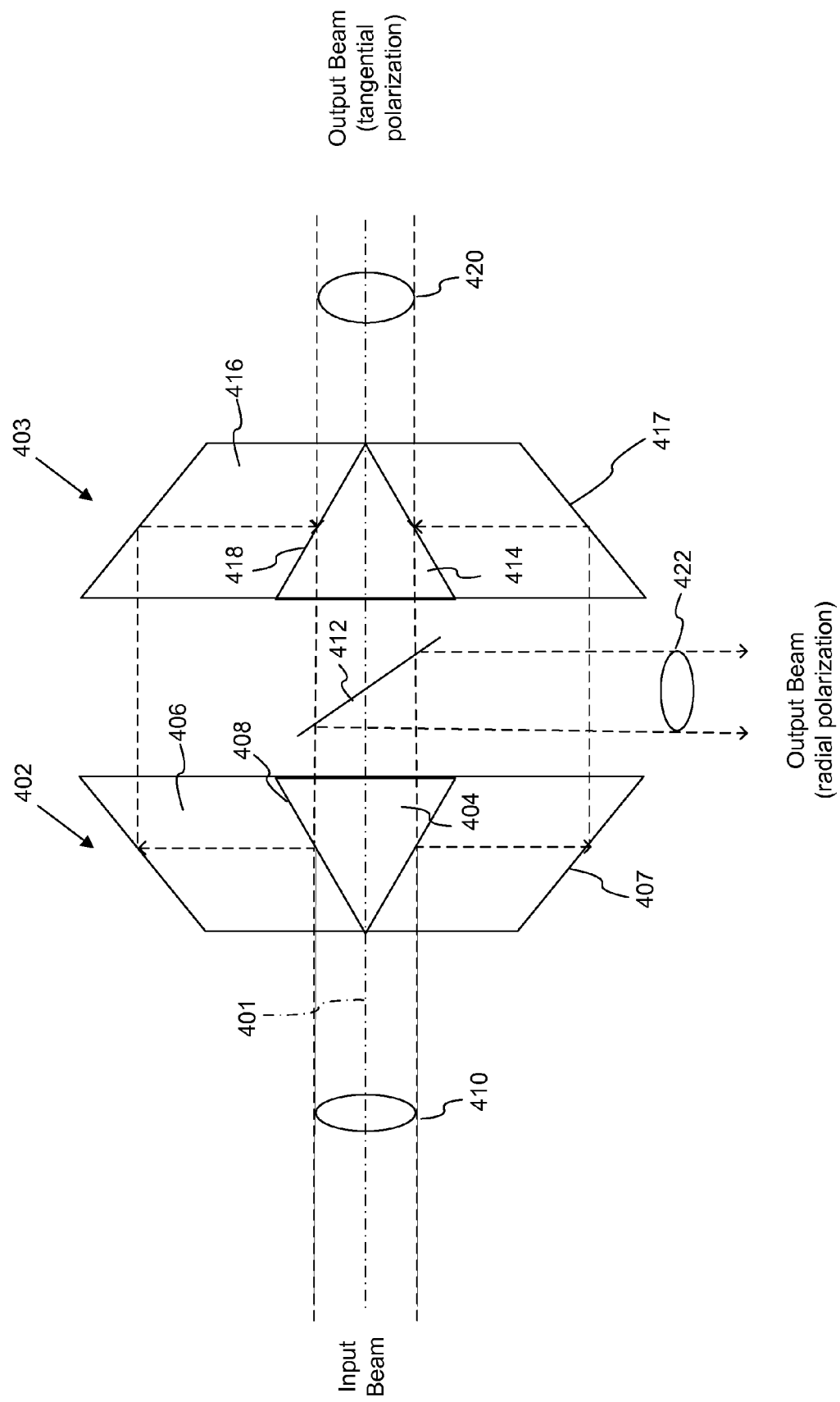
FIG. 4 is a schematic sectional diagram of an axicon-based polarizing beam splitter.

FIG. 4 illustrates a polarizer 400 that includes a first axicon assembly 402 and a second axicon assembly 403 situated on an axis 401. Each of the axicon assemblies 402, 403 include a pair of axicons that are arranged to separate radial and tangential polarization components to form radially and tangentially polarized optical beams. An input optical beam 410 is directed to the first axicon assembly 402 that includes an inner axicon 404 and an outer axicon 406 that contact at a surface 408. Portions of the input beam 410 that are polarized in the plane of incidence (p-polarized) are transmitted by the inner axicon 404 while portions of the input beam 410 that are polarized perpendicularly to the plane of incidence (s-polarized) are reflected at the surface 408. As noted above, because the outer and inner axicons are rotationally symmetric about the axis 401, the s-polarization corresponds to a tangential polarization and the p-polarization corresponds to a radial polarization. The surface 408 is typically provided with a dielectric coating to enhance the s-polarization reflectance and the p-polarization transmittance.

The radially polarized beam is reflected by a metallic or dielectric reflector 412 to form a radially polarized output beam 422. The tangentially polarized portions of the input beam are directed to an outer surface 407 of the outer axicon 406 and reflected to the second axicon assembly 403 to produce a tangentially polarized output beam 420. The second axicon assembly 403 includes an outer axicon 416 and an inner axicon 414 with a reflecting surface 417 situated at an interface between these two axicons. The tangentially polarized beam from the first axicon assembly 402 is reflected at the outer surface 417 of the outer axicon 416 to the reflecting surface 418 to form the tangentially polarized output beam 420. As shown in FIG. 4, the tangentially polarized output beam 420 does not include a central hole. The second axicon assembly 403 in FIG. 4 is substantially the same as the first axicon assembly 402, but in other examples the axicons can be differently configured. Similarly, while the reflective surfaces 407, 417 are parallel to reflective surfaces 408, 418 as shown in FIG. 4, in other examples, such surfaces are not parallel.

Figure 5:
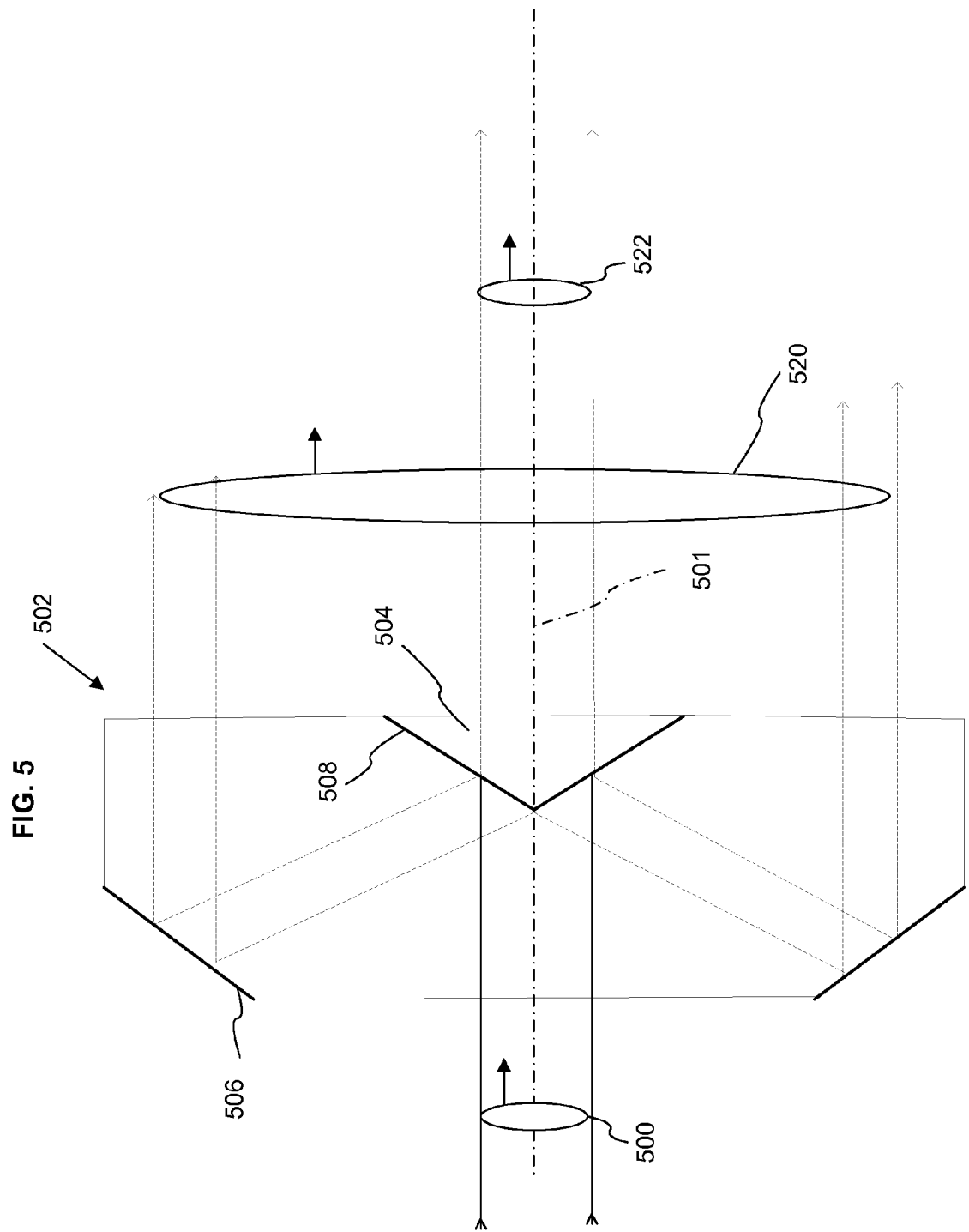
FIG. 5 is a schematic sectional diagram of an alternative embodiment to a polarizing beam separator.

In the examples of FIGS. 1-4, beam reflections are generally arranged so as to be along directions parallel or perpendicular to a cone axis (or axicon axis). Such directionality is not required. For example, as shown in FIG. 5, a polarizer 502 includes an inner axicon 504 and an outer axicon 506 arranged along an axis 501. An input beam 500 propagates along the axis 501 and tangentially polarized portions are reflected at a surface 508 that can be an interface between the axicons 504, 506 or an outer surface of the axicon 504 or an inner surface of the axicon 506. A surface of the outer axicon 506 reflects the tangentially polarized portions so as to from a tangentially polarized beam 520, while the radially polarized portion transmitted by the surface 508 forms a radially polarized beam 522.

The example polarizers and polarizing beam splitters described above can be used in a variety of applications. For example, the disclosed methods and apparatus can be used to provide radially or tangentially polarized beams (or both) to microscopes such as, multi-photon microscopes, optical lithography systems, or other applications.

Figure 6:
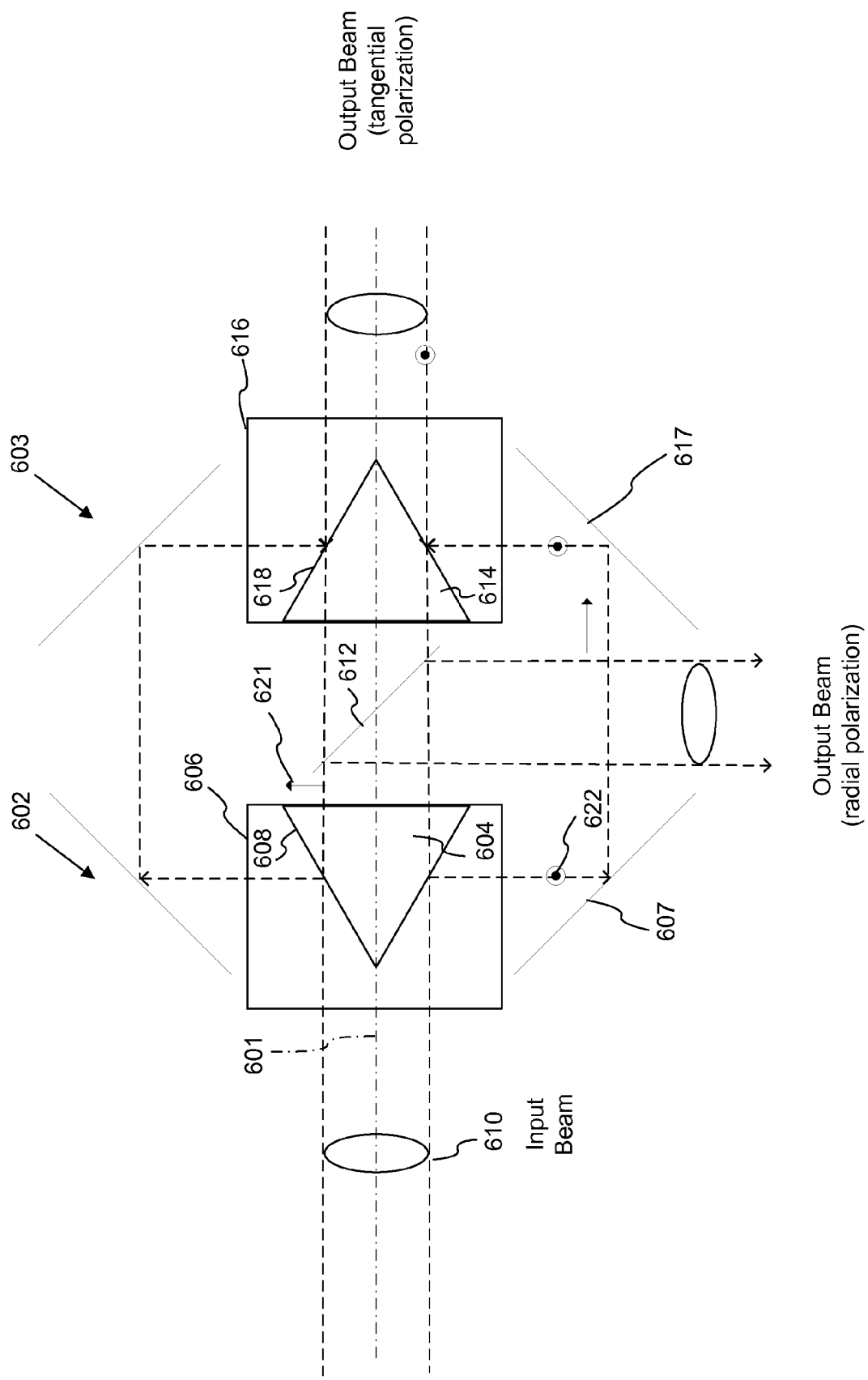
FIG. 6 is a schematic sectional diagram of a non-monolithic polarizing beam separator.

Referring to FIG. 6, a polarizer 602 includes an inner axicon 604 and a hollow outer axicon 607 arranged along an axis 601. An input beam 610 propagates along the axis 601 and tangentially polarized portions are reflected at a surface 608 that can be an outer surface of the axicon 604 or an interface surface between the axicon 604 and a transmissive optical element 606 that includes a relieved volume configured to receive the axicon 604. In typical examples, a multilayer, polarization dependent dielectric coating is applied, and embedding the inner axicon 604 in the element 606 facilitates polarization separation as well as providing a mechanically robust assembly. In other examples, an inner axicon can be defined by a conical relief volume in the transmissive optical element 606, and the conical axicon 604 omitted.

A radially polarized beam portion is transmitted through the element 606 and the axicon 604 and can be directed by a reflector 612 so that a radially polarized output beam can be formed and directed to a target or otherwise directed for a particular application. For purposes of illustration, a radial polarization is indicated with an arrow 621 and tangential polarization is indicated at 622 and is perpendicular to the plane of the drawing as shown. The tangentially polarized portion is directed to the outer axicon 607 and is reflected so as to propagate along the axis 601, but includes a central area or "hole" without optical power. The tangentially polarized portion can be recombined to form a tangentially polarized beam without the central hole by reflecting the tangentially polarized beam portion with a second outer axicon 617 and a second inner axicon 614. The second inner axicon 614 and the second outer axicon 617 can form a second polarizer 603 that include a transmissive element 616 so as to be substantially similar to the polarizer 602. However, the element 616 can be omitted, and a reflective surface 618 of the second inner axicon 614 need not provide a polarization-dependent reflectance as the incident beam is already polarized. In the example of FIG. 6, the axicons need not be secured to directly each other, but separate optical elements can be provided that are suitably situated with respect to each other with, for example, a mechanical support.

The example polarizers and polarizing beam splitters described above can be used in a variety of applications. For example, the disclosed methods and apparatus can be used to provide radially or tangentially polarized beams (or both) to microscopes such as, multi-photon microscopes, optical lithography systems, or other applications.

In view of the many possible embodiments to which the principles of our invention may be applied, it should be recognized that illustrated embodiments are only examples of the invention and should not be considered a limitation on the scope of the invention. Rather, the scope of the invention is defined by the following claims. I therefore claim as my invention all that comes within the scope and spirit of these claims.

I claim:

1. A polarizer, comprising:
a first inner axicon situated about an axis and configured to receive an input optical beam propagating along the axis, the first inner axicon including a polarizing reflective surface situated to reflect at least a portion of the input optical beam in a first state of polarization radially away from the axis; and
a first outer axicon situated about the axis and having a reflective surface situated to at least partially reflect the portion of the input optical beam reflected by the polarizing reflective surface of the inner axicon so as to propagate substantially along the axis;
a second outer axicon situated about the axis and having a reflective surface situated so as to at least partially reflect the portion of the optical beam reflected by the first outer axicon so as to propagate substantially perpendicularly to the axis; and
a second inner axicon situated about the axis so as to receive the optical beam reflected by the second outer axicon and reflect at least a portion of the optical beam reflected by the second outer axicon to produce an output optical beam in the first state of polarization that propagates along the axis and has a beam diameter corresponding to a beam diameter of the input optical beam.

2. The polarizer of claim 1, wherein the polarizing reflective surface is situated at an axially outer surface of the first inner axicon.

3. The polarizer of claim 2, wherein the polarizing reflective surface has a reflectance for the first state of polarization of at least 80% and a transmittance for a second state of polarization that is orthogonal to the first state of polarization of at least 80%.

4. The polarizer of claim 3, wherein the polarizing reflective surface is configured to reflect optical radiation propagating along the axis so as to propagate substantially perpendicular to the axis.

5. The polarizer of claim 4, wherein the first outer axicon includes a conical inner surface that defines a volume that receives at least a portion of the first inner axicon, wherein the axially outer surface of the first inner axicon is secured to the outer axicon at the conical inner surface.

6. The method of claim 5, wherein the polarizing reflective surface includes a multilayer coating situated at the conical inner surface of the first outer axicon.

7. The polarizer of claim 6, wherein the first state of polarization is a radial polarization with respect to the beam propagation axis and the second state of polarization is a tangential polarization with respect to the beam propagation axis or the second state of polarization is a radial polarization with respect to the beam propagation axis and the first state of polarization is a tangential polarization with respect to the beam propagation axis.

8. The polarizer of claim 1, wherein the first state of polarization is a radial polarization or a tangential polarization.

9. The polarizer of claim 1, wherein at least one of the first inner axicon and the first outer axicon is formed of an optically transparent solid material.

10. The polarizer of claim 1, further comprising a retardation plate situated so as to substantially convert the reflected beam portion in the first state of polarization to a second state of polarization that is substantially orthogonal to the first state of polarization.

11. The polarizer of claim 10, wherein the first state of polarization is a radial polarization and the second state of polarization is a tangential polarization or the second state of polarization is a radial polarization and the first state of polarization is a tangential polarization.

12. A polarizing beam splitter, comprising:
a first axicon pair situated along an axis and including an inner axicon and an outer axicon configured so that a portion of an incident beam in a first state of polarization is transmitted by the inner axicon and a portion of the incident beam in a second state of polarization is reflected by an outer surface of the outer axicon;
a second axicon pair situated along the axis and including an inner axicon and an outer axicon configured so that the portion of the incident beam reflected by the outer surface of the outer axicon of the first axicon pair is directed to an outer surface of the outer axicon of the second axicon pair and reflected by the inner axicon of the second axicon pair so as to form an output beam in a first state of polarization; and an optical reflector situated between the first axicon pair and the second axicon pair so as to receive and reflect the beam transmitted by the first axicon pair in the first state of polarization.

13. The polarizing beam splitter of claim 12, wherein the optical reflector is situated between the first axicon pair and the second axicon pair so as to receive and reflect the beam transmitted by the first axicon pair in the first state of polarization in a direction perpendicular to the axis.

14. The polarizing beam splitter of claim 12, wherein the first state of polarization is a radial polarization and the second state of polarization is a tangential polarization or the second state of polarization is a radial polarization and the first state of polarization is a tangential polarization.

15. The polarizing beam splitter of claim 12, wherein at least one of the inner axicons and the outer axicons are formed of an optically transparent solid material.

16. The polarizing beam splitter of claim 15, where the transparent material is glass or fused silica.

17. The polarizing beam splitter of claim 12, further comprising a retardation plate situated so as to substantially convert the beam portion in the first state of polarization to the second state of polarization or the beam portion in the second state of polarization to the first state of polarization.

18. The polarizing beam splitter of claim 17, wherein the first state of polarization is a radial polarization and the second state of polarization is a tangential polarization.

19. A method, comprising:
separating portions of an optical beam propagating along an axis and having beam portions in first and second states of polarization at a surface of a first axicon by reflecting the beam portion in the first state of polarization and transmitting the beam portion in a second state of polarization, wherein the first state of polarization is a tangential polarization and the second state of polarization is radial polarization;

situating a second axicon so that the reflected beam portion from the first axicon forms a beam in the first state of polarization that propagates along the axis; and situating a reflector so as to direct the beam in the second state of polarization in a direction perpendicular to the axis.

20. The method of claim 19, wherein the first axicon and the second axicon comprise a first axicon pair, and further comprising directing the beam in the first state of polarization to a second axicon pair so as to reduce a cross-sectional area of the beam.

21. The method of claim 20, wherein the optical beam propagating along the axis has an input beam diameter, and the second axicon pair is situated so that the beam in the first state of polarization is directed along the axis and has a beam diameter corresponding to the input beam diameter.

22. The polarizer of claim 1, wherein the first inner axicon and the first outer axicon are defined by surfaces of a solid prism.

23. The polarizer of claim 1, wherein the inner axicons of the first axicon pair and the second axicon pair are cones and the outer axicons of the first axicon pair and the second axicon pair are truncated cones.

24. The polarizer of claim 23, wherein the first axicon pair and the second axicon pair have a common cone angle.

* * * * *